(12) United States Patent
Ajiki et al.

(10) Patent No.: US 8,742,433 B2
(45) Date of Patent: Jun. 3, 2014

(54) SEMICONDUCTOR LIGHT EMITTING APPARATUS

(75) Inventors: Shuichi Ajiki, Tokyo (JP); Yasuyuki Kawakami, Tokyo (JP); Tsutomu Akagi, Tokyo (JP); Mitsunori Harada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 465 days.

(21) Appl. No.: 12/127,186

(22) Filed: May 27, 2008

(65) Prior Publication Data

US 2008/0290351 A1   Nov. 27, 2008

(30) Foreign Application Priority Data

May 24, 2007 (JP) ................................ 2007-138213

(51) Int. Cl.
*H01L 29/18* (2006.01)
(52) U.S. Cl.
USPC .................................... 257/88; 257/E33.061
(58) Field of Classification Search
USPC .................... 257/98, 99, 100, 676, E33.057, 257/E33.058, E33.059, E33.061
See application file for complete search history.

(56) References Cited

U.S. PATENT DOCUMENTS

| | | | | |
|---|---|---|---|---|
| 3,875,456 A | * | 4/1975 | Kano et al. | 313/501 |
| 2003/0038596 A1 | | 2/2003 | Ho | |
| 2005/0117334 A1 | * | 6/2005 | Lee et al. | 362/231 |
| 2005/0244993 A1 | | 11/2005 | Bogner et al. | |
| 2006/0022211 A1 | * | 2/2006 | Yatsuda et al. | 257/98 |
| 2008/0231169 A1 | * | 9/2008 | Hata et al. | 313/500 |

FOREIGN PATENT DOCUMENTS

| | | |
|---|---|---|
| EP | 1160883 | 12/2001 |
| EP | 1753035 | 2/2007 |
| JP | 2000-22222 A | 1/2000 |
| JP | 2003526212 | 9/2003 |
| JP | 2004-172578 A | 6/2004 |
| JP | 2004288760 | 10/2004 |
| JP | 2005-79202 A | 3/2005 |
| JP | 2005-109434 A | 4/2005 |
| JP | 2005-252222 A | 9/2005 |
| JP | 2005-286098 A | 10/2005 |
| JP | 2006-83219 A | 3/2006 |

(Continued)

OTHER PUBLICATIONS

Search Report from European Patent App. No. 08009482.4 (Aug. 7, 2008).

(Continued)

*Primary Examiner* — Vongsavanh Sengdara
(74) *Attorney, Agent, or Firm* — Kenealy Vaidya LLP

(57) ABSTRACT

A light emitting apparatus with a combination of a plurality of LED chips and a phosphor layer is provided and can be configured to significantly reduce variations in chromaticity and luminance. The plurality of semiconductor light emitting devices (LED chips) are disposed with a gap therebetween, and the phosphor layer is formed on the upper surface thereof to bridge over the gaps between the LED chips. The phosphor layer may be uniform in thickness, but can be less in thickness over the gaps between the LED chips than on the upper surface of the LED chips. The phosphor layer can be continuously formed on the upper surface of the array of the chips with no phosphor layer present in between the chips. This configuration allows for reducing variations in luminance and chromaticity which may result from the gaps or the phosphor layer present in between the gaps.

11 Claims, 10 Drawing Sheets

(56) References Cited

FOREIGN PATENT DOCUMENTS

| JP | 2006-86191 A | 3/2006 |
| JP | 2006-519500 A | 8/2006 |
| JP | 2006313886 | 11/2006 |
| JP | 2007-80876 A | 3/2007 |
| WO | 2005/091383 A1 | 9/2005 |
| WO | 2006-036251 A1 | 4/2006 |

OTHER PUBLICATIONS

Japanese Office Action for the related Japanese Patent Application No. 2012-019765 dated May 28, 2013.

* cited by examiner type1     type2     type3

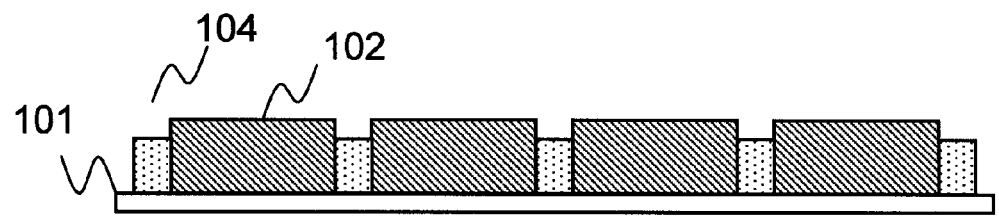
Fig. 7A
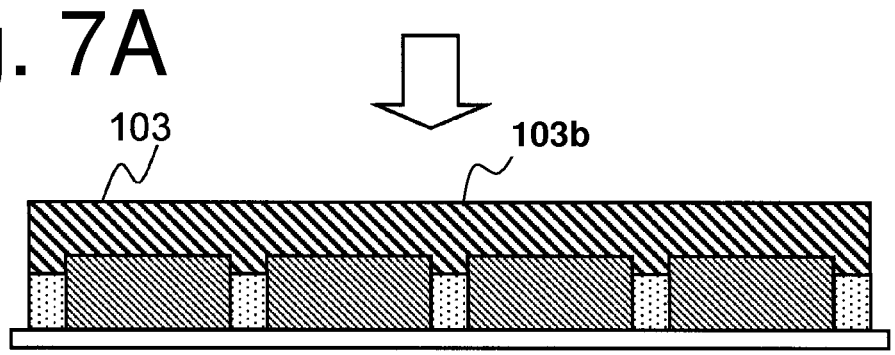
Fig. 7B
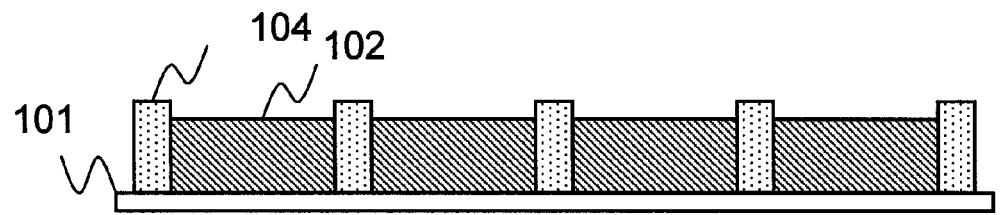
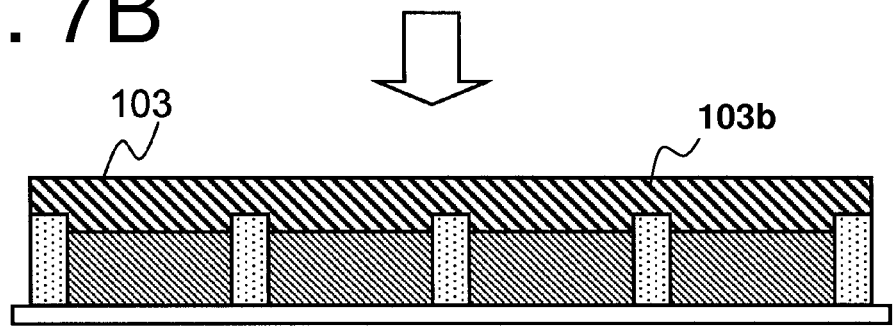

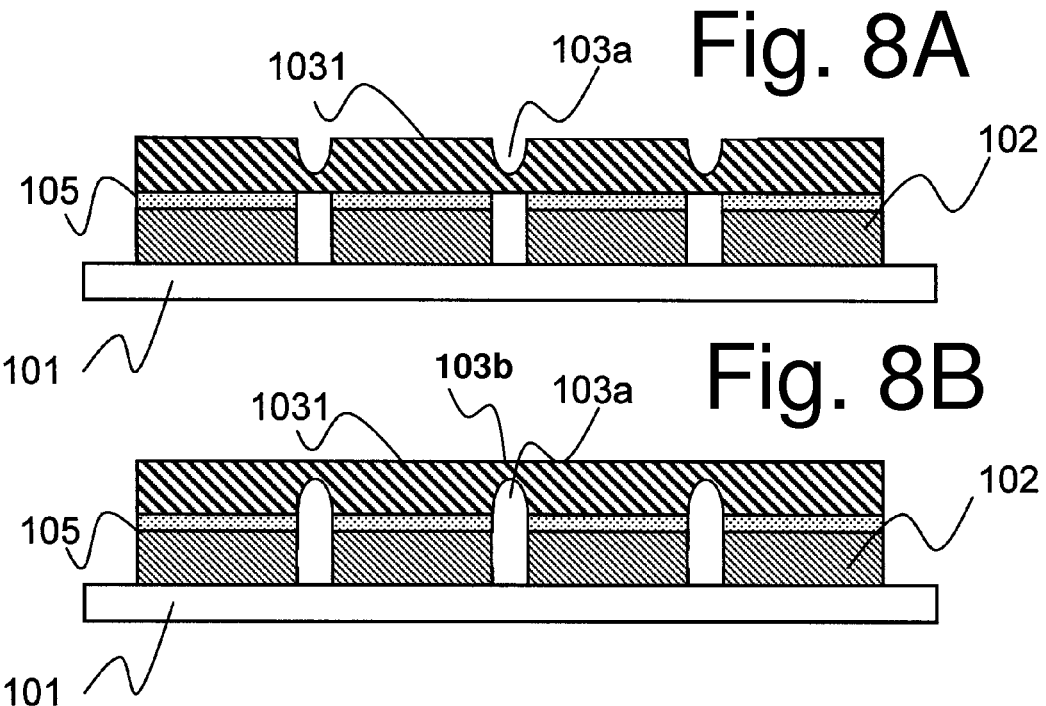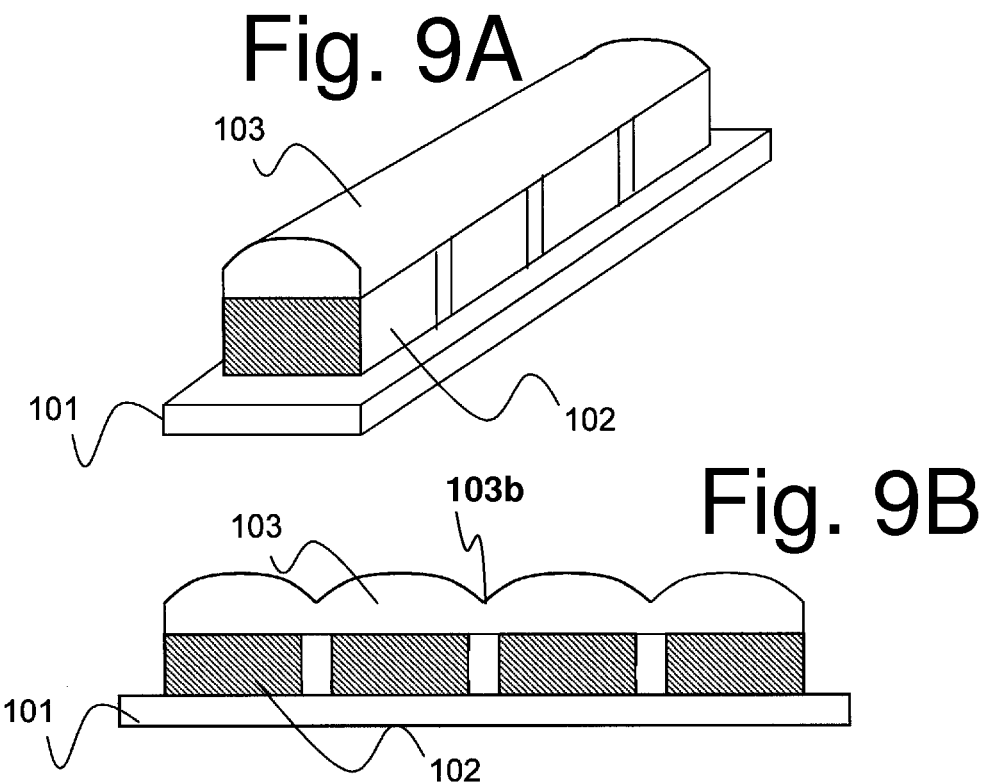

SEMICONDUCTOR LIGHT EMITTING APPARATUS

This application claims the priority benefit under 35 U.S.C. §119 of Japanese Patent Application No. 2007-138213 filed on May 24, 2007, which is hereby incorporated in its entirety by reference.

BACKGROUND

1. Technical Field

The presently disclosed subject matter relates to a semiconductor light emitting apparatus which includes an array of a plurality of semiconductor light emitting devices. In particular, the presently disclosed subject matter relates to a semiconductor light emitting apparatus which employs color-converted semiconductor devices to produce a color mixture of primary light emitted by the semiconductor devices and secondary light which includes light that has been color-converted by a color-converting phosphor material or the like using the primary light as excitation light.

2. Description of the Related Art

Semiconductor light emitting apparatuses which employ semiconductor light emitting devices (hereinafter referred to as "LED chips" or simply "chips") have been used for various types of illuminators such as headlights, streetlights, backlights, displays, ordinary lighting fixtures, etc. In order to produce light of a desired color, such as white light, semiconductor light emitting apparatuses often employ a combination of a light emitting device and a phosphor serving as a wavelength converting material. For such a semiconductor light emitting apparatus that utilizes color-converted semiconductor devices, the following methods may be employed to arrange a phosphor layer adjacent an array of a plurality of LED chips which are included in the light emitting apparatus.

As shown in FIG. 1A, one method includes applying a suspension containing a phosphor to an LED chip 122 mounted on a substrate 121, and to a contact electrode (not shown), and drying the suspension to thereby form a phosphor layer 123 in a uniform thickness around the LED chip 122. Such a method is disclosed, e.g., in Japanese Translation of PCT Patent Application No. 2003-526212 (corresponding Chinese Patent Application No. 01806034.X, European Patent application No. 2001919164, U.S. patent application Ser. No. 10/204,576). Another method includes forming a phosphor layer by screen printing using a metal mask that is patterned to the shape of a chip. This method is disclosed in Japanese Patent Application Laid-Open No. 2006-313886. According to this method, as shown in FIG. 1B, the phosphor layer 123 is deposited not only on the upper surface of a chip 122 but also between the chips 122. As shown in FIG. 1C, yet another method includes applying a resin dispersion containing a phosphor to individual LED chips 122, thereby forming a phosphor layer 123 only on the upper surface of the chips 122.

Another method other than the three methods mentioned above has also been suggested in which a phosphor layer is formed away from an array of a plurality of LED chips (see Japanese Patent Application Laid-Open No. 2004-288760).

In these conventional methods, a phosphor layer is directly formed on an LED chip as mentioned above. When an array of the plurality of LED chips is used, variations in chromaticity and luminance occur within an emission plane when viewed from above, in particular, in between the chips.

More specifically, when the individual chips 122 are coated with a phosphor layer as shown in FIG. 1A, emitted light is repeatedly reflected between the chips 122 and thus color-converted multiple times by the phosphor. This causes an increased amount of light component that is shifted toward the yellow wavelength area. Accordingly, when viewed from above the upper surface of the chip 122, a color shift towards yellow is observed in between the chips 122 with respect to the chromaticity immediately above the chips 122. To make matters worse, since no light emitting portions exist in between the chips 122, the non-light emitting portions appear as dark stripes in between the chips 122 when viewed from above the upper surface of the chips 122.

In the case in which the entirety of chips 122 are coated with a phosphor layer 123 as shown in FIG. 1B, a portion of the phosphor present in between the chips 122 may receive less excitation light than any other part thereof. In particular, the deeper (the closer to the substrate 121) in a particular portion of the phosphor, the less amount of excitation light reaches that particular portion. Accordingly, the phosphor can be considered to have a relatively higher concentration at that portion than at immediately above the chips 122, where a larger amount of excitation light is found. The apparent color provided by the light emitting apparatus depends on the color mixture of the color of light (excitation light) emitted by the chips 122 and the color of light emitted by the phosphor. Thus, when viewed from above the upper surface of the chips 122, a shift in color toward yellow is observed in between the chips 122 with respect to the apparent color exhibited immediately above the chips 122.

In the case when only the upper surface of the individual chips 122 are coated with the phosphor layer 123 as shown in FIG. 1C, a uniform color mixture may be obtained above the upper surface of the chips 122. However, due to the lack of emitted light components in between the chips 122, those non-light emitting portions in between the white-color light emitting chips 122 appear as dark stripes when viewed from above the upper surface of the chips 122.

When such a light emitting apparatus (LED package) is used as a light source for an optical system that is composed of a convex lens, a reflector and other components, variations in chromaticity and luminance may noticeably appear in the images projected by the system. To reduce these variations, a specific layer can be provided on top of the light emitting portion, with the layer containing a light diffusing agent, such as fine silica particles which can diffuse and scatter light. Nevertheless, this is not enough to eliminate those variations in chromaticity and luminance, but possibly raises another problem in that the light diffusion layer causes a decrease in luminous flux.

In contrast to this, the phosphor layer can be arranged over the upper surface of a plurality of LED chips with a gap between the chips and the layer. In this case, the aforementioned variations in chromaticity and luminance are significantly suppressed. However, this type of light emitting apparatus is difficult to reduce its light source in size. To facilitate optical designs, light sources should be desirably reduced in size.

SUMMARY

The presently disclosed subject matter was devised in view of these and other problems and in association with the conventional art. According to an aspect of the presently disclosed subject matter, a light emitting apparatus which includes LED chips can be provided directly with a wavelength conversion layer which reduces variations in chromaticity and luminance.

According to another aspect of the presently disclosed subject matter, a semiconductor light emitting apparatus can include a plurality of semiconductor light emitting devices, each having an upper surface and side surfaces, the light emitting devices being spaced from each other with a gap between side surfaces of adjacent devices. A wavelength conversion layer can be provided which contains a wavelength conversion material for wavelength conversion of at least part of light emitted by the semiconductor light emitting devices, the wavelength conversion layer being formed to bridge the upper surfaces of all of the semiconductor light emitting devices.

In the semiconductor light emitting apparatus configured as described above, the semiconductor light emitting device may include an opaque device substrate and a semiconductor stack section formed on the opaque device substrate, with the stack section having side surfaces. The side surfaces of the semiconductor stack section may be covered with the wavelength conversion layer.

In the semiconductor light emitting apparatus configured as described above, the semiconductor light emitting device may include a transparent device substrate and a semiconductor stack section formed on the transparent device substrate, with the stack section having side surfaces. The side surfaces of the semiconductor light emitting device that do not face to the other semiconductor light emitting device may be covered with either of a wavelength conversion layer and a reflective layer or both.

In the semiconductor light emitting apparatus configured as described above, the gap between the semiconductor light emitting devices may be filled with a filling member that can include a reflective member and/or a scattering member.

In the semiconductor light emitting apparatus configured as described above, the filling member may be configured to be higher than the upper surface of the semiconductor light emitting device.

In the semiconductor light emitting apparatus configured as described above, portions of the wavelength conversion layer corresponding to the above-described gaps may be configured to be thinner than a thickness thereof on the upper surface of the semiconductor light emitting device.

In the semiconductor light emitting apparatus configured as described above, the wavelength conversion material may be a phosphor.

The wavelength conversion layer is formed to link between the upper surface portions (substantial light emitting portions) of the plurality of LED chips that are separately provided, thereby allowing emitted light to be provided with reduced variations in luminance and chromaticity within the emission plane.

BRIEF DESCRIPTION OF THE DRAWINGS

These and other characteristics, features, and advantages of the presently disclosed subject matter will become clear from the following description with reference to the accompanying drawings, wherein:

FIGS. 7A and 7B are schematic side views illustrating a semiconductor light emitting apparatus according to a fourth exemplary embodiment of the presently disclosed subject matter;

FIGS. 8A and 8B are schematic side views illustrating a semiconductor light emitting apparatus according to a fifth exemplary embodiment of the presently disclosed subject matter;

FIGS. 9A and 9B are a perspective view and schematic side view, respectively, illustrating a semiconductor light emitting apparatus according to another exemplary embodiment of the presently disclosed subject matter;

DETAILED DESCRIPTION OF EMBODIMENTS

A description will now be made below to light emitting apparatuses of the presently disclosed subject matter with reference to the accompanying drawings in accordance with exemplary embodiments.

By way of example, the exemplary embodiments to be discussed below employ a so-called white LED apparatus with an array of a plurality of LED chips disposed on one substrate (package). The white LED apparatus can include a combination of blue light emitting LEDs and a YAG-based phosphor which is used as a wavelength conversion material and is excited by the blue light emitted by the LEDs to emit yellowish orange color light. A color mixture of the blue light and the yellowish orange light then can occur, thereby providing complementary white illumination. However, the presently disclosed subject matter is not limited to a white LED apparatus configured as described above, but may also be applicable to any LED apparatuses so long as they employ color-converted light emitting devices to provide a given emission of light using a combination of LEDs and wavelength conversion material.

Figure 2A:
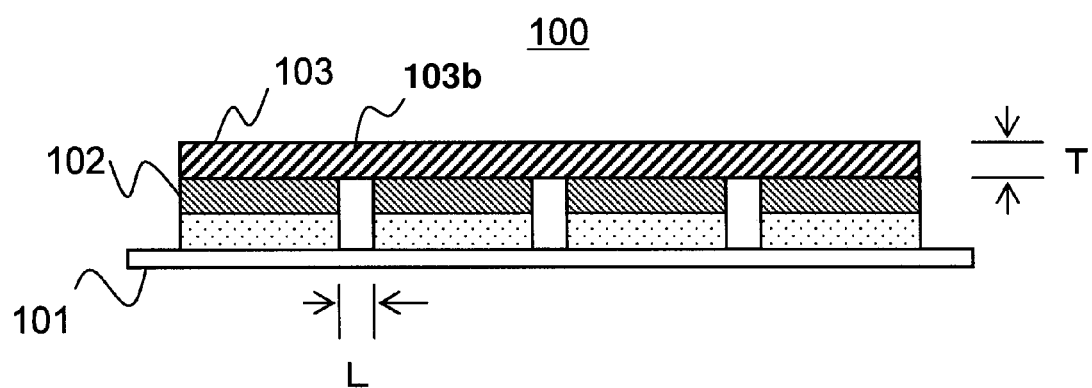
FIGS. 2A and 2B are a schematic side and top view, respectively, illustrating a semiconductor light emitting apparatus according to a first exemplary embodiment of the presently disclosed subject matter.
Figure 2B:
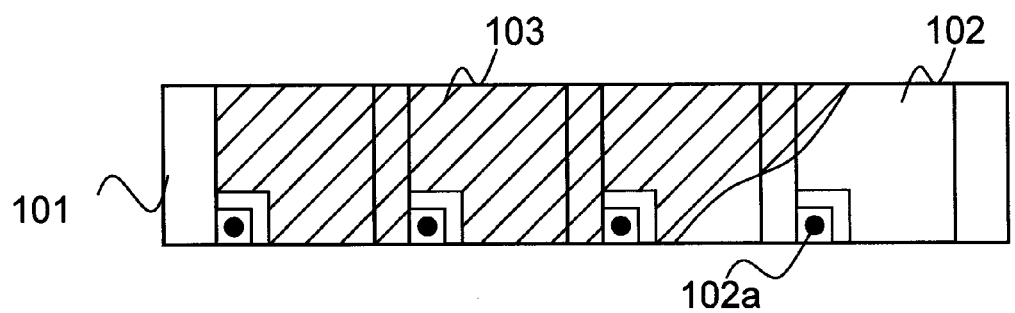

FIGS. 2A and 2B show a first exemplary embodiment. FIG. 2A illustrates a cross-sectional view of a white LED apparatus with four LED chips 102 disposed on one substrate 101, and FIG. 2B illustrates the white LED apparatus when viewed from above the upper surface thereof. Although only part of the LED chips are hidden under a wavelength conversion layer 103 (hereinafter, referred to also as a "phosphor layer") as shown in FIG. 2B, the entire upper surface of the LED chips can actually be coated with the phosphor layer 103.

Note that individual LED chips will be hereinafter referred to as an LED chip or a chip, and an array of four chips as a chip array.

Figures 3A, 3B, 3C:
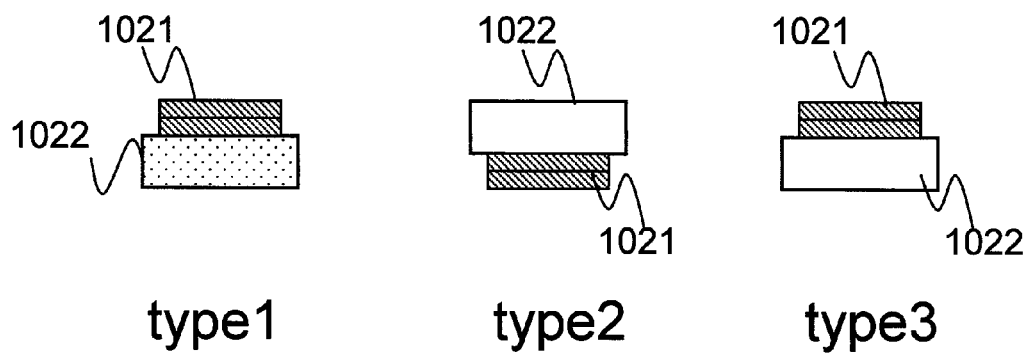
FIGS. 3A, 3B and 3C are schematic side views illustrating a semiconductor device used for a semiconductor light emitting apparatus of the presently disclosed subject matter.

The LED chips 102 are each configured to have one or more electrically conductive semiconductor layers (of n-type or p-type) deposited, for example, on a device substrate, and may be classified into three types as shown in FIGS. 3A to 3C depending on the type of the device substrate and how the semiconductor layers are arranged. The chip of type 1 shown in FIG. 3A has semiconductor layers (semiconductor stack section) 1021 deposited on an opaque device substrate 1022, allowing light to be transmitted through the semiconductor layers (light emission side). This type of chip has generally Lambertian directional characteristics. The semiconductor layers 1021 are extremely thinner than the device substrate and their side surfaces are less than their upper surface in the size of emission area, resulting in the side surfaces transmitting extremely lower output as compared to the upper surface. The chip of type 2 shown in FIG. 3B has semiconductor layers (semiconductor stack section) 1021 deposited on a transparent device substrate 1022, allowing light to be transmitted through the device substrate (light emission side). The chip of type 3 shown in FIG. 3C has semiconductor layers 1021 deposited on a transparent device substrate 1022, allowing light to be transmitted through the semiconductor layers (light emission side). Chips types 2 and 3 allow light to be transmitted through the side surfaces of the transparent device substrate, resulting in the side surfaces transmitting generally the same output as the upper surface. Each of the exemplary embodiments of the presently disclosed subject matter is applicable to any one of these types of LED chips 102. However, the first exemplary embodiment is applicable particularly to the LED chip of type 1, in which no leakage of light is allowed from the device substrate 1022.

An upper surface of the LED chip 102 can include a pad section 102a for wire bonding of the semiconductor layers 1021. Although the LED chip 102 shown in FIGS. 2A and 2B has only one pad section 102a, it may also have two or more pad sections. The LED chip 102 may also have no electrode formed on its upper surface, i.e., electrical connection may be established only to its lower surface.

As illustrated, the white LED apparatus 100 of the present exemplary embodiment is configured such that four LED chips 102 are disposed at predetermined intervals on the substrate 101, and a phosphor layer 103 is formed continuously on the upper surface of the LED chips 102 and over the gaps (spacings) between the chips 102. That is, the phosphor layer 103 forms bridge structure 103b that bridge over the gaps between the chips 102. In other words, the phosphor layer 103 forms bridge structures 103b located between adjacent devices as viewed from the light emitting direction of the apparatus, the bridge structures being spaced from the substrate in the light emitting direction of the apparatus by an area that does not include the wavelength conversion layer. On the upper surface of the LED chip 102, the phosphor layer 103 is not formed at the pad section 102a that is designed for wire bonding.

The spacing L (μm) between the LED chips 102 may depend on the directional characteristics of the light emitted from the LED chips, but may be normally in the range of from 30 μm to 250 μm, and can be in the range of from 50 μm to 120 μm. As the spacing L increases, the amount of light emitted by phosphor particles within this portion increases, thereby causing a yellow color to become predominant in this area.

The thickness T (μm) of the phosphor layer 103 is normally in the range of from 50 μm to 400 μm, and can be in the range of from 50 μm to 250 μm, although it also depends on the spacing L between the LED chips 102. As the thickness of the phosphor layer increases, light ray components also increase which propagate through the phosphor layer along a longer optical path. Accordingly, fluorescence components which shift the light emitted toward the yellow wavelength area increase principally in the edge directions, thereby likely causing variations in chromaticity and luminance to occur.

The phosphor layer 103 can be made of a material which contains dispersed phosphor such as YAG-based phosphor in a resin such as silicone resin, epoxy resin, acrylic resin, etc. The phosphor layer 103 can be deposited by stencil printing using a mask or by screen printing, etc. In order to improve the printability and ease of the bridging of the phosphor layer material (coating liquid), a thickener such as fumed silica can be added to the coating liquid, thereby desirably enhancing the viscosity and thixotropy of the coating liquid.

A thin sheet made of a material which contains a phosphor dispersed in resin may be prepared as a phosphor sheet, which is then attached to the upper surface of the LED chips 102 using an adhesive or the like to serve as the phosphor layer 103.

Figure 4:
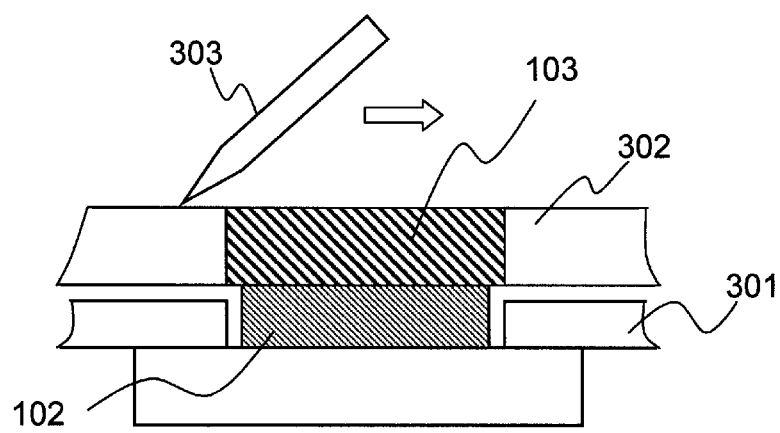
FIG. 4 is an explanatory view illustrating a fabrication method for the semiconductor light emitting apparatus shown in FIGS. 2A and 2B.

For example, the white LED apparatus 100 of the present embodiment can be fabricated as follows. First, the four LED chips 102 are die-bonded onto the substrate 101. Then, as shown in FIG. 4, a spacer mask 301 that is generally the same in thickness as or slightly thinner than the chip 102 is positioned to surround the sides of the chip 102 in two directions, i.e., in the lateral and transverse directions of the chip array. Additionally, a metal mask 302 that is the same in thickness as the phosphor layer 103 and provided with an opening to cover the pad section 102a is positioned on the upper surface of the chip 102. Then, a squeegee 303 is used to apply a phosphor layer coating liquid by stencil printing, and the coating is then cured to thereby form the phosphor layer 103. Finally, each of the LED chips 102 is wire bonded at the pad section 102a.

Note that in the cross-sectional view of FIG. 4, the spacer mask 301 is shown to have an opening larger in width than the chip. The opening can be shaped to cover the wire bonding pad on the upper surface of the chip when viewed in another cross-sectional view. Accordingly, during printing, the metal mask is located in contact with the wire bonding pad, so that no phosphor layer is formed on the wire bonding pad. Using the spacer mask in this manner can eliminates or reduce the occurrence of the problem in which the metal mask is deformed thereby causing the squeegee to be caught by the metal mask during printing. It is also possible to prevent the phosphor layer from being made thinner than its intended design thickness due to the metal mask being deformed.

As another fabrication method of the presently described embodiment, a phosphor sheet may also be used. In this case, for example, a phosphor layer material is deposited on a releasable heat-resistant film by stencil printing using the aforementioned metal mask 302, and then cured to thereby obtain such a phosphor sheet. On the other hand, the four LED chips 102 can be die-bonded onto the substrate 101, and then each of the LED chips 102 can be wire bonded at the pad section 102a. The phosphor sheet can then be adhered onto the upper surface of the chips to which an adhesive such as a silicone-based adhesive has been applied in advance. A white LED apparatus is thus obtained which has a uniform phosphor layer formed on the upper surface of the chips and over the gaps in between the chips.

In the case of the method employing the phosphor sheet, the phosphor sheet can be placed after the wire bonding at the pad section 102a occurs. It is thus possible to avoid contaminating the wire bonding pad. This method has some advantages or differences as compared to the stencil printing fabrication method. For example, this method causes little or no variations to occur in thickness of the phosphor layer even in the presence of variations in height of the chips as well as a step-wise difference in the height. Furthermore, upon placement of the phosphor sheet on the chips, the surface tension of the adhesive allows the edges of the chips and those of the phosphor sheet to self-align with each other. It is thus possible to position the phosphor sheet with accuracy.

In the presently described embodiment, the phosphor layer 103 is formed to bridge over the gaps in between the chips, so that no phosphor is present in between the chips, especially near the substrate. This configuration allows the bridge portion, or bridge structure 103b, of the phosphor layer 103 to emit light by the excitation light coming from the chips on both sides. It is thus possible to reduce the likelihood of striped dark non-light emitting portions appearing in between the chips and thus preventing the amount of phosphor from becoming excessive relative to the amount of excitation light reaching the phosphor. Thus, variations in luminance and chromaticity can be reduced.

In contrast to this, with a transparent resin filled in between the LED chips, light from the phosphor layer incident upon the transparent resin portion in between the chips would be absorbed on the sides of the chips and the upper surface of the substrate. In this case, decreases in luminance would occur in between the LED chips. Conversely, in the present embodiment, there can exist an air layer between the LED chips. The air layer can reflect light received from the phosphor layer, thereby allowing for more effectively preventing decreases in luminance in between the chips. For this reason, it is possible to form an air layer, or a reflective layer or a scattering layer in between the LED chips as discussed later. Accordingly, to seal the LED apparatus of the presently disclosed subject matter, such a transparent resin to which no reflective material or scattering material is added is preferably not filled at least in between the LED chips.

Figure 5A:
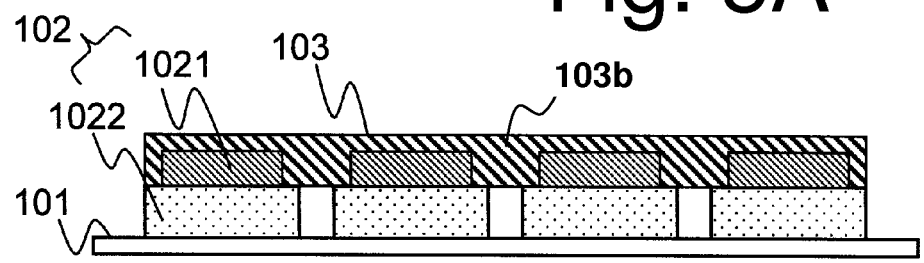
FIGS. 5A and 5B are schematic side views illustrating a semiconductor light emitting apparatus according to a second exemplary embodiment of the presently disclosed subject matter.
Figure 5B:
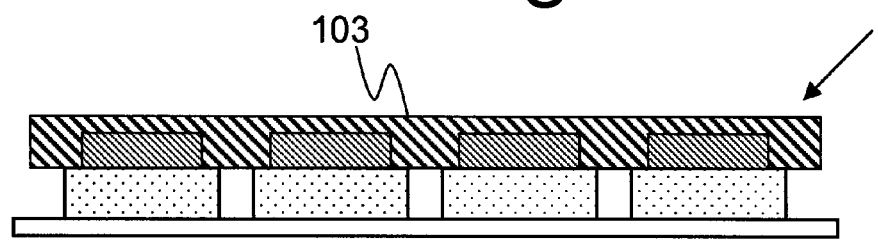

FIGS. 5A and 5B show white LED apparatuses of a second exemplary embodiment. The present exemplary embodiment can be the same as the first exemplary embodiment in that the phosphor layer 103 is formed to bridge the chips via bridge structures 103b. However, the second exemplary embodiment can be different from the first exemplary embodiment in that the semiconductor layer 1021 of the LED chip 102 is smaller than the device substrate 1022, and the phosphor layer 103 is formed to cover not only the upper surface of the semiconductor layer 1021 but also the side surfaces thereof. Except for the differences mentioned above, the configuration of the LED chips 102 and the material of the phosphor layer can be the same as those of the first exemplary embodiment, and thus will not be explained repeatedly.

The white LED apparatus of the present exemplary embodiment may be fabricated, for example, by applying a phosphor layer coating liquid to form the phosphor layer. In this method, a spacer mask which is approximately the same in thickness as the device substrate 1022 is used (not shown), while a metal mask is also used which has a total thickness of the semiconductor layer 1021 and the phosphor layer formed on the upper surface of the semiconductor layer 1021. As shown in FIG. 5A, this method allows for forming the phosphor layer 103 which entirely covers the semiconductor layer 1021 and bridges the chips.

The white LED apparatus of the presently described exemplary embodiment may incorporate any one of the three types of LED chips as shown in FIGS. 3A to 3C, but is biased for use with the LED chip of type 1 that provides far greater output from the side surfaces than from the upper surface. Note that as shown with an arrow in FIG. 5B, the phosphor layer 103 may also have projections to completely cover the end portions.

The white LED apparatus of the present exemplary embodiment is also provided with the phosphor layer 103 that bridges the chips. This configuration allows for reducing striped dark non-light emitting portions which would otherwise appear in between the chips, thereby reducing variations in chromaticity and luminance. Furthermore, in the present exemplary embodiment, since the semiconductor layer serving as a light emitting portion is entirely covered with the phosphor layer, effective use can be made of light emitted from the semiconductor layer. Moreover, as compared with the LED apparatus shown in FIG. 1B, the phosphor layer 103 can be reduced in thickness in between the chips. It is thus possible to reduce a difference in apparent colors, i.e., a variation in chromaticity, caused by a difference in relative phosphor concentrations which results from the difference in the amounts of excitation light between immediately above the upper surface of the chips and in between the chips.

Figure 6A:
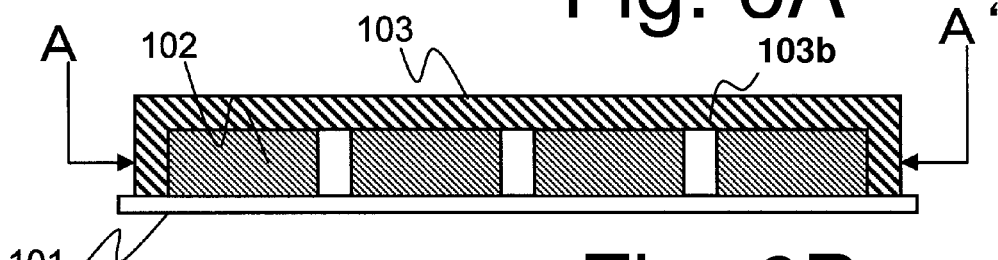
FIGS. 6A and 6B are schematic side views illustrating a semiconductor light emitting apparatus according to a third exemplary embodiment of the presently disclosed subject matter.
Figure 6B:
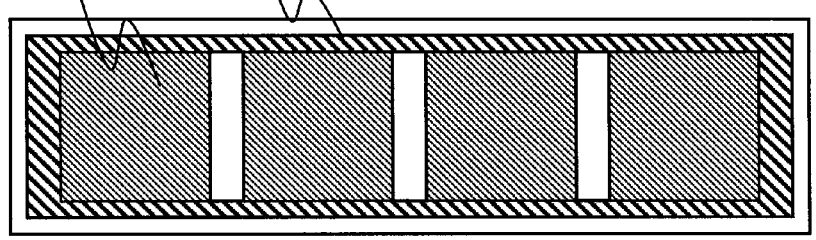

FIGS. 6A and 6B show an LED apparatus of a third exemplary embodiment, FIG. 6A illustrating a side cross-sectional view thereof and FIG. 6B illustrating a cross-sectional view taken along the line A-A' of FIG. 6A.

The LED apparatus of the present exemplary embodiment is different from that of the first exemplary embodiment at least in that the phosphor layer is also formed on both the lateral and transverse sides of the LED chip array, as illustrated. The other portions of this exemplary configuration can be the same as that of the first exemplary embodiment. The LED apparatus of the presently described exemplary embodiment can be designed to incorporate the LED chip of type 2 or type 3 among the three types as shown in FIGS. 3B and 3C, but could use other chip types (e.g., chip type 1) as well. Each of types 2 and 3 includes the transparent device substrate and the semiconductor layers, and provides approximately the same output from the sides of the substrate as the output from the upper side of the combination thereof. As mentioned above, the sides of the chip array can be coated with the phosphor layer 103 as well. This configuration allows for using the output from the sides as excitation light for the phosphor layer provided on the sides to emit light. It is thus possible to increase the overall output from the LED apparatus.

Note that instead of the phosphor layer formed on the sides of the LED chip array, it is also possible to employ a reflective layer formed of a resin or the like which contains a white pigment or a reflective material, etc. For example, before the phosphor layer is formed on the upper side, the phosphor layer or the reflective layer to be provided on the sides may be formed by carrying out stencil printing several times with the spacer mask interposed in the gaps between the chips. Alternatively, the phosphor layer or the reflective layer may also be formed by adhering a phosphor sheet or a reflective sheet around the chip array. A bridge structure 103b is located between each of the semiconductor devices in this embodiment and spaced from substrate 101.

Another example of an LED apparatus made in accordance with the presently disclosed subject matter is shown in FIGS. 7A and 7B. As illustrated, in the presently described exemplary embodiment, before the phosphor layer 103 is deposited, a filler is filled in between the chips 102 to form a rib 104. In the present exemplary embodiment, the height of the rib 104 can be adjusted so that the thickness of the phosphor layer 103 on the upper surface of the chips differs from the thickness of the phosphor layer located in the gaps between the chips. Additionally, a highly reflective material can be used as the material forming the rib, thereby reducing a decrease in luminance in between the chips.

The height of the rib 104 can be greater than the thickness of the chip 102. More specifically, the height of a portion of the rib that projects above the upper surface of the chip can be ¼ or more the thickness of the phosphor layer on the chips. In other words, the thickness of the portion of the phosphor layer that bridges the chips (i.e., the bridge structures 103*b*) can be ¾ or less the thickness of the phosphor layer on the upper surface of the chips. The filler is not limited to a particular material, but may be of resin. More specifically, the filler may be formed of a resin which contains a reflective material such as white pigment or reflective particles or of a resin which contains a scattering material, etc. Fine particles such as $TiO_2$ or $ZrO_2$ may also be added to the filler. Use of a reflective filler or a resin containing a scattering material can reduce the amount of light to be absorbed in between the chips and allow light to be reflected and extracted out of the upper surface. It is thus possible to prevent decreases in luminance in between the chips.

As with the first to third exemplary embodiments, the LED apparatus of the present exemplary embodiment can also be fabricated in such a manner that the phosphor layer is formed by stencil printing using a metal mask or the like on the array of chips mounted on the substrate, and then the chips can be wire bonded at their pad sections.

Note that although the LED apparatus illustrated has a phosphor layer formed only on the upper side of the chip array, the phosphor layer may also be provided on both of the sides of the chip array as in the third exemplary embodiment. In this case, with the filler left as it is on both the sides in the longitudinal direction in the figure, the phosphor layer may be provided only on both the sides in a direction orthogonal to that direction (i.e., in the direction perpendicular to the drawing). Alternatively, the phosphor layer may be provided in place of the filler present on both the sides in the longitudinal direction. These configurations can be appropriately selected depending on the type of the chip and application for the apparatus.

The LED apparatus of the present exemplary embodiment includes the fabrication process of providing the filler in between the chips. However, because the filler is present, the phosphor layer can be more easily formed by a coating process than in the case when a gap is present in between the chips. Furthermore, the height of the rib, i.e., the thickness of the phosphor layer located in between the chips can be adjusted, thereby controlling the apparent color. It is thus possible to provide an LED apparatus with reduced variations in chromaticity.

An LED apparatus of a fifth exemplary embodiment is characterized in that the thickness of the phosphor layer present in between chips is less than the thickness of the phosphor layer present on the upper surface of the chips. In the aforementioned first to third exemplary embodiments, the phosphor layer can be formed to have an entirely uniform thickness, or to have greater thickness between the chips. The color of light emitted from the LED apparatus is determined by the color mixture of the color emitted by the chips and the color emitted by the phosphor. Thus, in between the chips where the amount of light emitted by the chips is reduced, the color from the phosphor becomes more predominant which provides luminance that is shifted in wavelength toward the yellow spectrum area when the thickness of the phosphor layer is the same as or greater than that on the upper surface of the chips. In contrast, in the present exemplary embodiment, the phosphor layer present in between the chips can be made thinner in thickness than the phosphor layer on the upper surface, thereby reducing the unevenness in apparent color.

The LED apparatus of the fifth exemplary embodiment employs such a phosphor sheet whose thickness is position dependent in order to provide a phosphor layer that varies in thickness with positions. FIGS. 8A and 8B illustrate a side cross-sectional view of the LED apparatus of the present exemplary embodiment.

As illustrated, the phosphor sheet 1031 employed in the present exemplary embodiment can be provided on its surface with depressed portions 103*a* or indents which each have generally the same diameter as the spacing between the chips. The depressed portions 103*a* can be formed at the same intervals as the chips are arranged and can coincide with the bridge structures 103*b*. Such a phosphor sheet 1031 can be made by injection molding using a mold, or by debossing a phosphor film, which is made on a releasable film by stencil printing as in the first exemplary embodiment, before the film is completely cured. Alternatively, the phosphor sheet 1031 can be made by stencil printing on a releasable film on which projected portions have been formed. The depressed portions 103*a* illustrated have a semi-circular cross section, but may also have any shape such as a letter "V" or "U", etc. However, the semi-circular shape provides good mold releasability and strength required for making the sheet.

The LED apparatus shown in FIG. 8A employs as the phosphor layer a phosphor sheet 1031 which is adhered to the chip array using an adhesive 105 so that the surface on which the depressed portions 103*a* are formed serves as the upper surface (through which light is transmitted). For an LED apparatus shown in FIG. 8B, the phosphor sheet 1031 is adhered to the chip array using the adhesive 105 so that the surface of the phosphor sheet 1031 on which no depressed portions 103*a* are formed serves as the upper surface (through which light is transmitted). In either case, the phosphor sheet 1031 is positioned so that the depressed portions 103*a* are aligned with spacings between the chips.

Like the fourth exemplary embodiment, the present exemplary embodiment can further reduce the unevenness in apparent color by making the thickness of the phosphor layer present in between the chips less than the thickness of the phosphor layer on the upper surface. Any of the LED apparatuses shown in FIGS. 8A and 8B can be configured to provide the same effects in that the thickness of the phosphor layer present in between the chips is reduced. However, in the LED apparatus shown in FIG. 8B, a protrusion of the adhesive 105 can be reduced and leakage of light from the protruded adhesive portion can be prevented. Furthermore, according to the present exemplary embodiment, use of the phosphor sheet can serve to avoid contamination of the wire bonding pads, and can form phosphor layers of a desired thickness even in the presence of variations in the height of the chips.

In the foregoing, light emitting apparatuses of the presently disclosed subject matter according to first to fifth exemplary embodiments have been described. It will be understood by those skilled in the art that the light emitting apparatuses of the presently disclosed subject matter can also be implemented by appropriately combining these exemplary embodiments together, incorporating other components, or modifying the shape of the phosphor layer, chips, reflective layers, etc.

For example, the shape of the phosphor layer described above was illustrated as being shaped like a plate or having depressed portions associated with the gaps between the chips. However, for example, as shown in FIGS. 9A and 9B, the phosphor layer can also be shaped like a letter "C" or a cylindrical lens.

It is also possible to form the phosphor layer in a different shape by staking a layer free from phosphor particles on a plate-shaped phosphor layer. Examples of the layer free from phosphor particles include a resin layer of a higher refractive index or a resin layer which contains a light-scattering material such as silica particles used for light-scattering purposes.

It is also possible to form a rib even when a phosphor sheet is used.

First Example

Four LED chips, each having a side length of 980 μm, were mounted onto a ceramic package (substrate) at a spacing of L=200 μm between the chips. A phosphor layer 200 μm in thickness was formed on the LED chips by stencil printing (metal mask printing).

To form the phosphor layer, a phosphor dispersion of a silicone-based thermosetting resin was used, which was prepared by mixing the silicone-based thermosetting resin with a 27 wt % YAG-based phosphor and a 13 wt % fumed silica for controlling viscosity. The phosphor layer was printed using a stainless-steel stencil (metal mask) 200 μm in thickness. After having been printed, the phosphor layer was heated at 150 degrees centigrade for two hours to cure the silicone resin, thereby forming the phosphor layer to be substantially the same thickness as the metal mask. After that, the pad sections on the upper surface of the LED chips were bonded with gold wire, thereby fabricating an LED apparatus in the configuration as shown in FIGS. 2A and 2B. In this LED apparatus, an air layer was formed between the chips under the phosphor layer.

Comparative Example 1

Figure 1A:
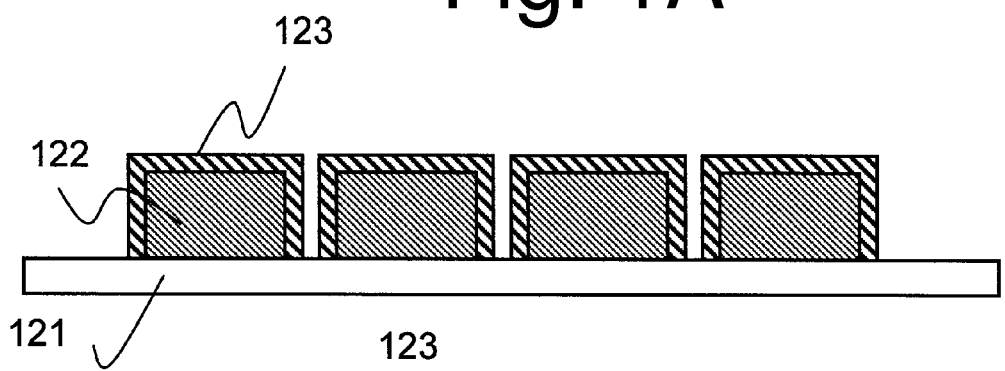
FIGS. 1A, 1B and 1C are views illustrating respective conventional semiconductor light emitting apparatuses.

An LED apparatus which had the same array of LED chips as that of the first example was used such that phosphor particles were allowed to adhere by electrophoretic deposition to cover the individual chips. Subsequently, the surfaces thereof were coated with a silicone-based thermosetting resin, thereby fabricating an LED apparatus configured as shown in FIG. 1A. The phosphor layer was approximately 30 μm in thickness.

Comparative Example 2

Figure 1B:
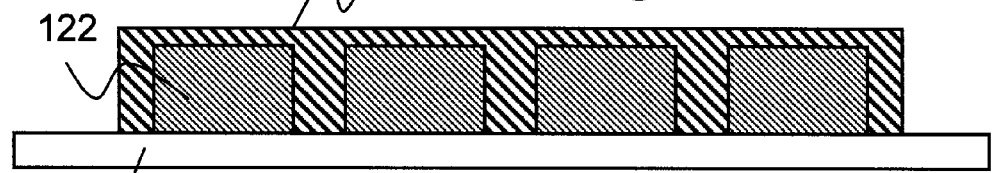
Figure 1C:
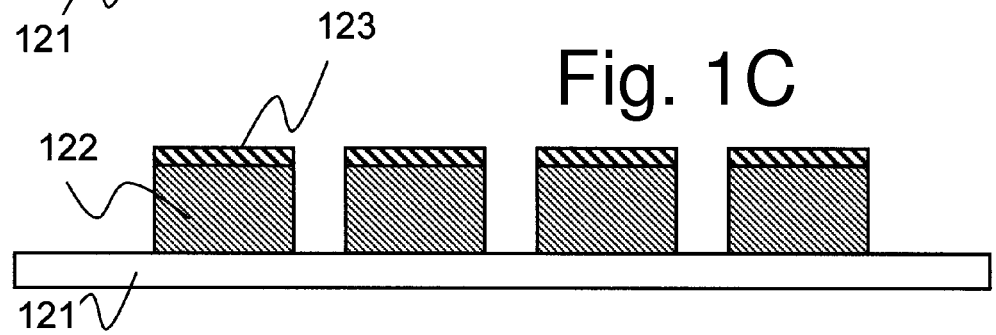

An LED apparatus which had the same array of LED chips as that of the first example was used such that a phosphor dispersion of a silicone-based thermosetting resin mixed with a 27 wt % YAG-based phosphor covered the chip array and the area between the chips. The LED apparatus was thus configured as shown in FIG. 1B. The phosphor layer was approximately 200 μm in thickness.

Figure 10A:
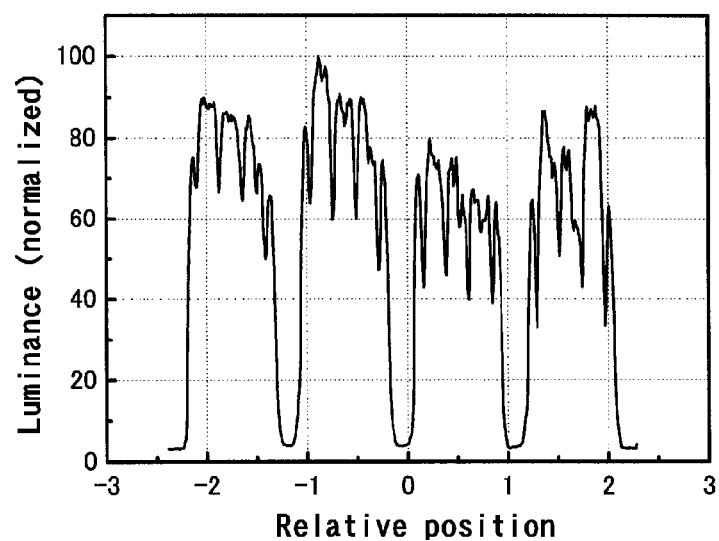
FIGS. 10A, 10B and 10C are graphs illustrating the luminance distribution of LED apparatuses according to a first example and comparative examples.
Figure 10B:
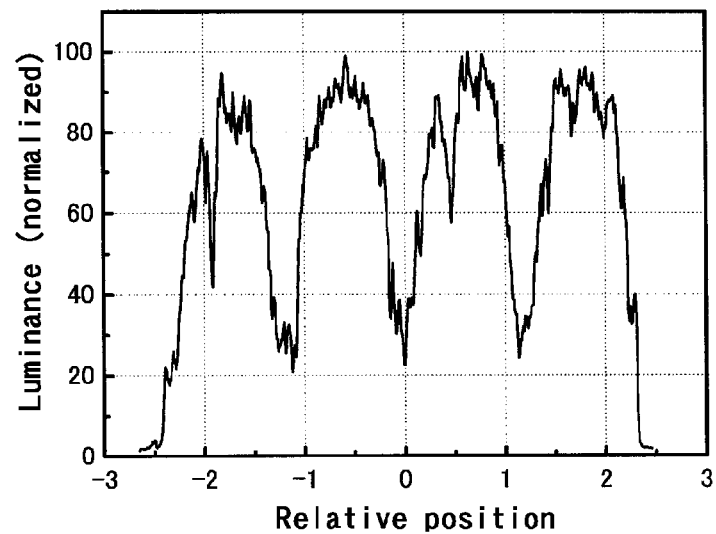
Figure 10C:
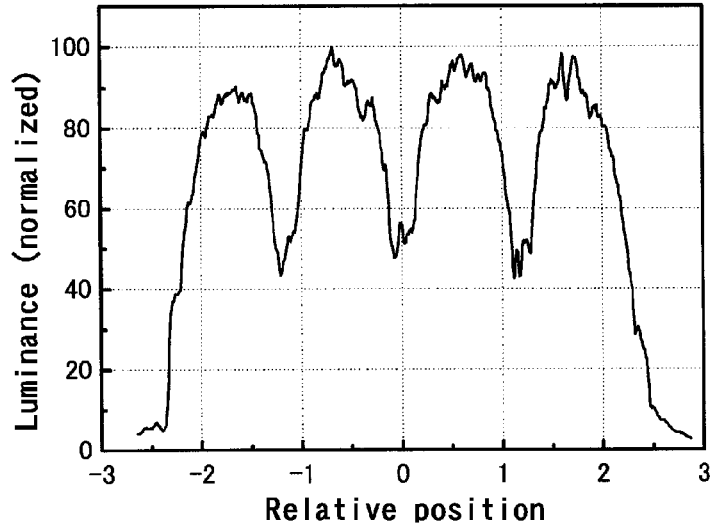

Measurements were made with respect to the luminance distribution and the chromaticity distribution of the LED apparatuses that were fabricated according to the first example and the comparative examples 1 and 2. The results of the measurements on the luminance distribution are shown in FIGS. 10A to 10C. FIG. 10A shows the results of the comparative example 1, FIG. 10B those of the comparative example 2, and FIG. 10C those of the first example. These figures show the luminance distributions within an emission plane and obtained immediately above the packages and plotted along a longitudinal cross section. The values in the graphs were normalized with the maximum luminance reduced to 100%. The horizontal axis represents the relative position of the LED chips on the package (zero at the center).

From the results shown, it can be seen that the LED apparatus of the first example has reduced variations in luminance in between the chips (a ratio of decrease in luminance with respect to the maximum luminance; those portions that look like valleys in the figure).

Figure 11A:
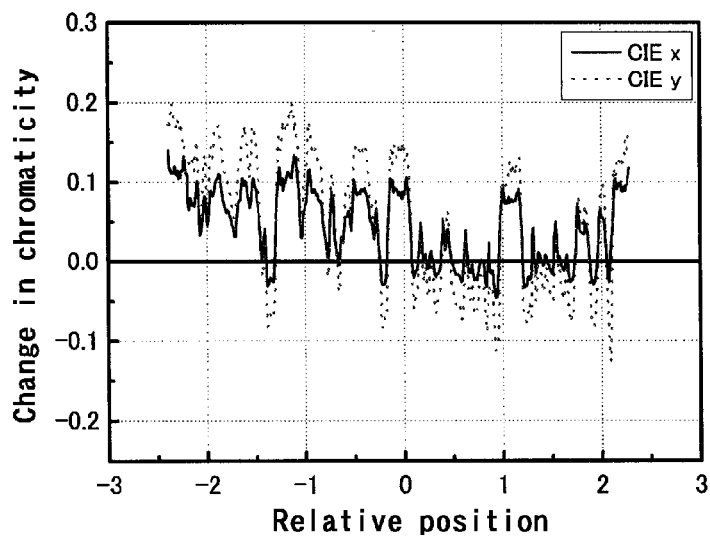
FIGS. 11A, 11B and 11C are graphs illustrating the chromaticity distribution of LED apparatuses according to the first example and the comparative examples.
Figure 11B:
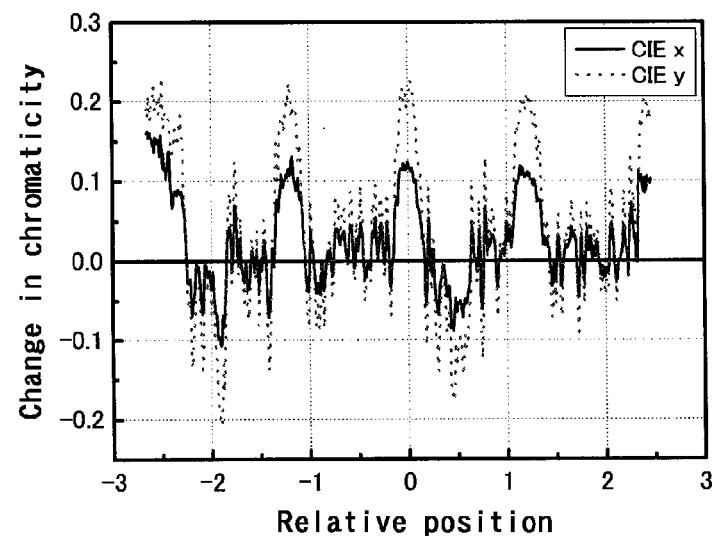
Figure 11C:
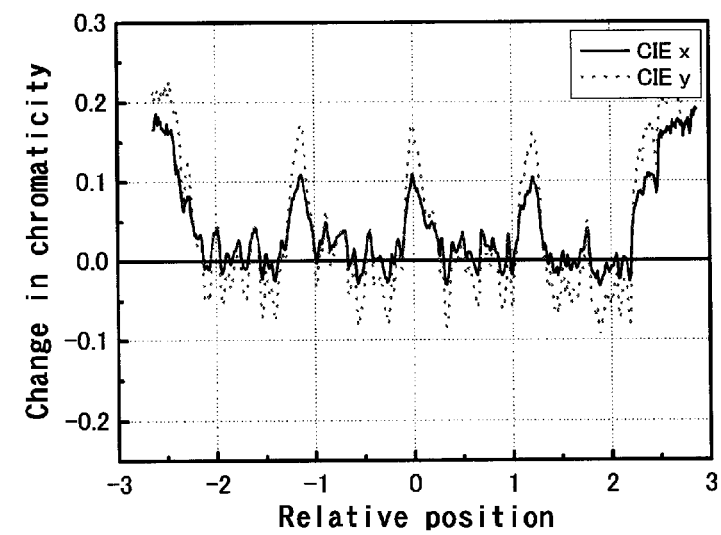

The results of the measurements on the chromaticity distribution are shown in FIGS. 11A to 11C. FIG. 11A shows the results of the comparative example 1, FIG. 11B those of the comparative example 2, and FIG. 11C those of the first example. These figures show the chromaticity distributions within an emission plane and obtained immediately above the packages and plotted along a longitudinal cross section. The values in the graphs show changes in chromaticity with respect to the chromaticity (the x and y values in CIE 1931) on the chips. The horizontal axis represents the relative position of the LED chips on the package (zero at the center).

From the results shown, it can be seen that the LED apparatus of the first example has reduced differences in chromaticity that appear in between the chips (the solid lines indicating the x values and the dotted lines indicating the y values). In particular, the y values (the dotted lines) have a reduced range of changes. This implies that shifts toward yellow will be hardly observed.

Second Example

Four LED chips, each having a side length of 980 μm and a height of 100 μm, were mounted onto a ceramic package (substrate) at a spacing of L=100 μm between the chips using an electrically conductive adhesive made of AuSn and approximately 30 μm in thickness. A one-component thermosetting adhesive liquid silicone resin (white) that contains 30 to 40% of titanium oxide was injected into the three gaps between the chips to fill in the gaps, and then cured by heating to thereby fill the space in between the chips. The silicone resin mixed with titanium oxide has a height of approximately 120 μm, and is lower than the upper surface of the chips that are mounted on the substrate via the electrically conductive adhesive. As in the first example, a phosphor layer of 200 μm in thickness was formed on the LED chips by stencil printing (metal mask printing). Subsequently, the pad sections on the upper surface of the LED chips were bonded with gold wire, thereby fabricating the LED apparatus configured as shown in FIG. 7A.

Figure 12A:
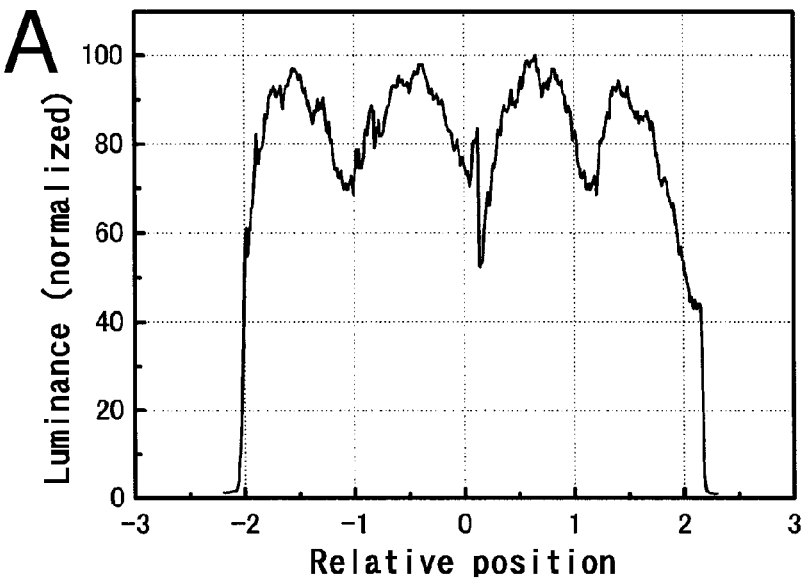
FIGS. 12A and 12B are graphs illustrating the luminance distribution and the chromaticity distribution of an LED apparatus according to the embodiment of FIGS. 5A and 5B.
Figure 12B:
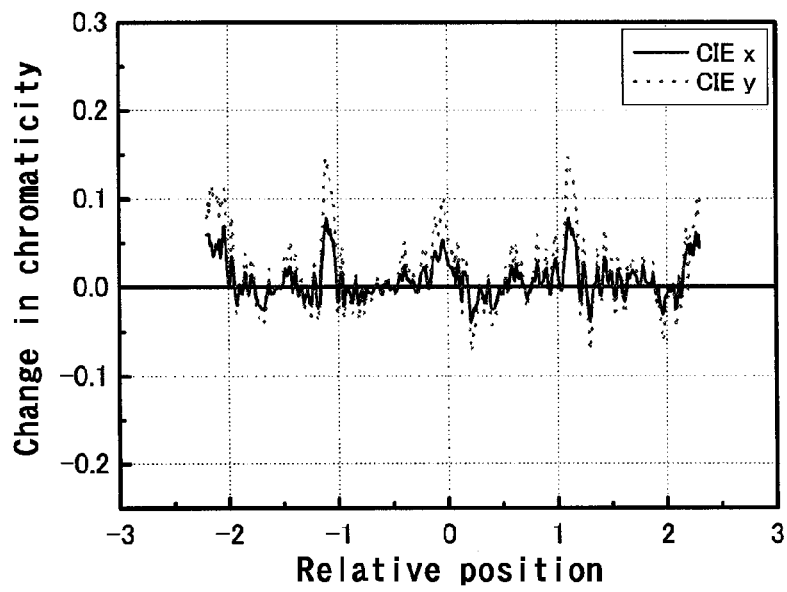

As described with respect to the first example, the LED apparatus of the second example was also measured from immediately above the package with respect to luminance distribution and chromaticity distribution within an emission plane. The results of the measurements are shown in FIGS. 12A and 12B; FIG. 12A showing the luminance distribution and FIG. 12B the chromaticity distribution. The results show that in the LED apparatus of the second example, light emitted by the phosphor in between the chips is reflected by the white filler and extracted out of the upper surface, thereby preventing a decrease in luminance in between the chips. This in turn reduces variations in luminance within the plane as well as variations in chromaticity.

Note that in the present example, the resin (rib) filled in between the chips is lower in height than the upper surface of the chips. However, the rib may also be made higher than the upper surface of the chips as shown in FIG. 7B. To form a rib that is higher than the upper surface of the chips, it can be formed by printing using a mask.

Third Example

Four LED chips, each having a side length of 980 μm and a height of 100 μm, were mounted onto a ceramic package (substrate) at a spacing of L=100 µm between the chips using an electrically conductive adhesive made of AuSn and approximately 30 µm in thickness.

Figure 13A:
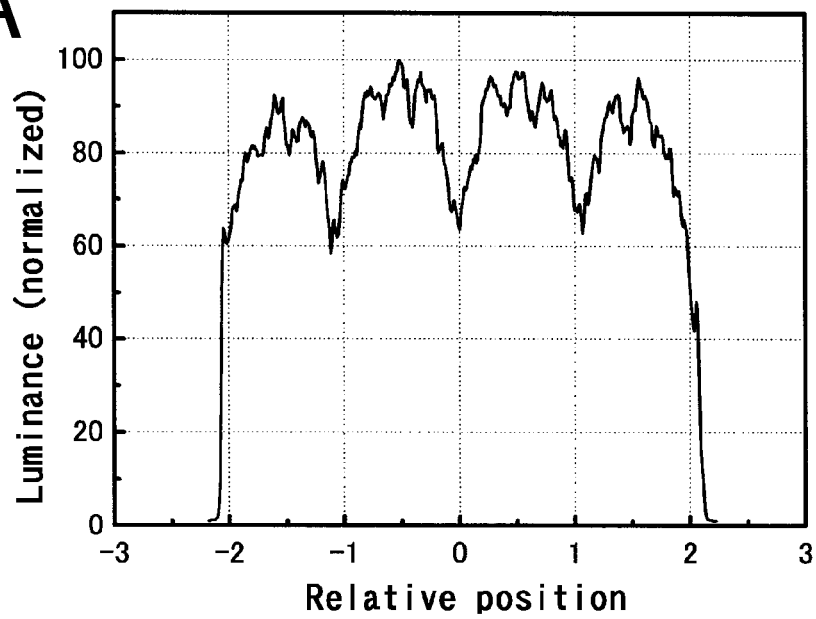
FIGS. 13A and 13B are views illustrating the luminance distribution and the chromaticity distribution of an LED apparatus according to the embodiment of FIGS. 6A and 6B.
Figure 13B:
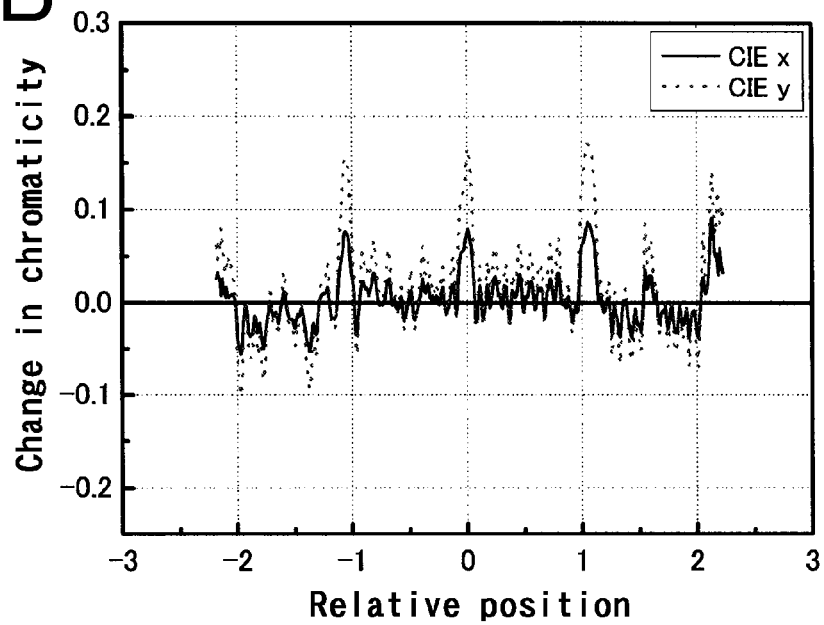

A dispersed silicone resin mixed with 23 wt % of titanium oxide of an average particle diameter D50 of 21 nm (before dispersed) and 9 wt % of a thickener of fumed silica was printed using a metal mask. The resin was then cured by heating, thereby forming a rib of a height of 200 µm between the chips. Subsequently, a phosphor layer was formed by metal mask printing on the upper surface of the LED chips and on the rib, so that the phosphor layer had a flat top, and a thickness of 200 µm from the upper surface of the chips and of approximately 130 µm from the upper surface of the rib. Subsequently, the pad sections on the upper surface of the LED chips were bonded with gold wire, thereby fabricating the LED apparatus configured as shown in FIG. 7B without ribs on both ends of the LED apparatus. As in the first example, the LED apparatus of the third example was also measured from immediately above the package with respect to luminance distribution and chromaticity distribution within an emission plane. The results of the measurements are shown in FIGS. 13A and 13B; FIG. 13A showing the luminance distribution and FIG. 13B the chromaticity distribution. In the case of the LED device of the third example, light emitted by the phosphor in between the chips is reflected by the rib and extracted out of the upper surface, thereby preventing a decrease in luminance in between the chips. This in turn reduces variations in luminance within the plane as well as variations in chromaticity.

The presently disclosed subject matter is applicable to white LEDs, LED headlights, LED streetlights, backlights, displays, ordinary lighting fixtures, etc. In particular, the presently disclosed subject matter is effectively applicable to those illuminators that project variations on an emission plane in chromaticity and luminance as they are. Examples of those illuminators include LEDs for use with an optical system which employs a convex lens and a reflector to project images using the emission plane as a light source image; headlight packages; and streetlight packages.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light emitting apparatus having a light emitting direction, comprising:
    a substrate;
    a plurality of semiconductor light emitting devices located adjacent the substrate, each having an upper surface and side surfaces, the light emitting devices being spaced from each other with a gap between side surfaces of adjacent semiconductor light emitting devices, the semiconductor light emitting device having a semiconductor layer; and
    a wavelength conversion layer which contains a wavelength conversion material for wavelength conversion of at least part of light emitted by the semiconductor light emitting devices, the wavelength conversion layer having a constant thickness over the semiconductor layer in a cross-section along a direction in which the plurality of semiconductor light emitting devices are arranged, the wavelength conversion layer being located adjacent to the upper surface of the semiconductor light emitting device so as to be in contact therewith with or without an adhesive, the wavelength conversion layer bridging the upper surfaces of adjacent semiconductor light emitting devices such that the wavelength conversion layer forms bridge structures located between adjacent semiconductor light emitting devices as viewed from the light emitting direction of the apparatus, the bridge structures being spaced from the substrate in the light emitting direction of the apparatus by an area of the gap that does not include the wavelength conversion layer, where the area of the gap extends from and abuts the side surfaces of adjacent semiconductor light emitting devices, wherein
    the gap between the semiconductor light emitting devices is completely filled with a filling member which is a white resin including a reflective member, the filling member has an uppermost surface in the light emitting direction that is located higher than the upper surface of the semiconductor light emitting device and is thus located further from the substrate than is the upper surface of the semiconductor light emitting device, and a thickness of the wavelength conversion layer located at each of the gaps is different from a thickness of the wavelength conversion layer located at the upper surface of the semiconductor light emitting device in the light emitting direction.

2. The semiconductor light emitting apparatus according to claim 1, wherein the semiconductor light emitting devices include an opaque device substrate and a semiconductor stack section formed on the opaque device substrate and having side surfaces, the side surfaces of the semiconductor stack section being substantially covered with the wavelength conversion layer.

3. The semiconductor light emitting apparatus according to claim 2, wherein the wavelength conversion material is a phosphor.

4. The semiconductor light emitting apparatus according to claim 1, wherein the semiconductor light emitting devices include a transparent device substrate and a semiconductor stack section formed on the transparent device substrate and having side surfaces, side surfaces of the semiconductor light emitting device that do not face toward other semiconductor light emitting devices are substantially covered with at least one of the wavelength conversion layer and a reflective layer.

5. The semiconductor light emitting apparatus according to claim 4, wherein the wavelength conversion material is a phosphor.

6. The semiconductor light emitting apparatus according to claim 1, wherein the portions of the wavelength conversion layer located at the gaps are thinner than the thickness of the wavelength conversion layer located at the upper surface of the semiconductor light emitting device in the light emitting direction.

7. The semiconductor light emitting apparatus according to claim 1, wherein the wavelength conversion material is a phosphor.

8. The semiconductor light emitting apparatus according to claim 1, wherein the wavelength conversion layer includes indents in an upper surface facing away from the substrate.

9. The semiconductor light emitting apparatus according to claim 1, wherein the wavelength conversion layer includes indents in a lower surface facing the substrate.

10. The semiconductor light emitting apparatus according to claim 1, wherein the wavelength conversion layer bridges the upper surfaces of all of the semiconductor light emitting devices.

11. The semiconductor light emitting apparatus according to claim 1, wherein the substrate extends underneath and intersects an optical axis of at least three of the semiconductor light emitting devices.

* * * * *